United States Patent
Kobayakawa

(10) Patent No.: US 9,379,295 B2
(45) Date of Patent: Jun. 28, 2016

(54) METHOD FOR MANUFACTURING LED MODULE, AND LED MODULE

(75) Inventor: Masahiko Kobayakawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 70 days.

(21) Appl. No.: 13/145,176

(22) PCT Filed: Jan. 15, 2010

(86) PCT No.: PCT/JP2010/050380
§ 371 (c)(1),
(2), (4) Date: Jul. 19, 2011

(87) PCT Pub. No.: WO2010/082614
PCT Pub. Date: Jul. 22, 2010

(65) Prior Publication Data
US 2011/0278623 A1 Nov. 17, 2011

(30) Foreign Application Priority Data
Jan. 19, 2009 (JP) .................. 2009-008762

(51) Int. Cl.
| H01L 33/52 | (2010.01) |
| H01L 33/54 | (2010.01) |
| H01L 33/56 | (2010.01) |
| H01L 33/60 | (2010.01) |
| B29C 45/16 | (2006.01) |
| H01L 33/48 | (2010.01) |
| B29C 45/14 | (2006.01) |
| H01L 33/00 | (2010.01) |
| H01L 33/50 | (2010.01) |

(52) U.S. Cl.
CPC ............ *H01L 33/54* (2013.01); *B29C 45/1671* (2013.01); *H01L 33/483* (2013.01); *H01L 33/52* (2013.01); *H01L 33/60* (2013.01); *B29C 45/14655* (2013.01); *H01L 33/005* (2013.01); *H01L 33/508* (2013.01); *H01L 2224/32245* (2013.01); *H01L 2224/48091* (2013.01); *H01L 2224/48247* (2013.01); *H01L 2224/73265* (2013.01); *H01L 2924/01322* (2013.01)

(58) Field of Classification Search
None
See application file for complete search history.

(56) References Cited

U.S. PATENT DOCUMENTS

| 6,747,293 | B2 * | 6/2004 | Nitta et al. ................ 257/99 |
| 7,301,176 | B2 | 11/2007 | Abe et al. |
| 7,476,913 | B2 * | 1/2009 | Isobe et al. ................ 257/98 |
| 2001/0000622 | A1 * | 5/2001 | Reeh et al. ................. 257/98 |
| 2004/0036081 | A1 * | 2/2004 | Okazaki ..................... 257/99 |

(Continued)

FOREIGN PATENT DOCUMENTS

| CN | 1674241 | 9/2005 |
| CN | 1691361 | 11/2005 |

(Continued)

*Primary Examiner* — Johannes P Mondt
(74) *Attorney, Agent, or Firm* — Hamre, Schumann, Mueller & Larson, P.C.

(57) ABSTRACT

A method for manufacturing an LED module is provided that includes the steps of mounting an LED chip 2 on an obverse surface of leads 1A', 1B', and after the step of mounting the LED chip 2, providing a case 6 that covers part of the leads 1A', 1B' and includes a reflective surface 61 surrounding the LED chip 2 in an in-plane direction of the leads 1A', 1B'. With this arrangement, there is no risk that the arm for handling the LED chip 2 interferes with the case 6. This allows the distance between the reflective surface 61 and the LED chip 2 to be reduced, and hence allows making the LED module more compact.

10 Claims, 12 Drawing Sheets

(56) References Cited

U.S. PATENT DOCUMENTS

| | | | |
|---|---|---|---|
| 2005/0199884 A1* | 9/2005 | Lee | H01L 33/54 257/79 |
| 2005/0206016 A1 | 9/2005 | Shohji et al. | |
| 2006/0284207 A1 | 12/2006 | Park et al. | |
| 2007/0090381 A1* | 4/2007 | Otsuka et al. | 257/98 |
| 2008/0042157 A1 | 2/2008 | Su et al. | |
| 2008/0049430 A1* | 2/2008 | Sakumoto | 362/296 |
| 2008/0054285 A1* | 3/2008 | Park | 257/98 |
| 2009/0004778 A1* | 1/2009 | Lee et al. | 438/113 |
| 2009/0296367 A1* | 12/2009 | Sekine et al. | 362/84 |

FOREIGN PATENT DOCUMENTS

| | | | |
|---|---|---|---|
| JP | 2006-210490 | 8/2006 | |
| JP | 2007-5801 | 1/2007 | |
| JP | 2008-10591 | 1/2008 | |
| JP | 2008010591 A * | 1/2008 | H01L 33/00 |
| JP | 2009-506530 | 2/2009 | |
| JP | 2009-71012 | 4/2009 | |
| TW | 200802923 | 1/2008 | |

* cited by examiner

METHOD FOR MANUFACTURING LED MODULE, AND LED MODULE

TECHNICAL FIELD

The present invention relates to a method for manufacturing an LED module and also relates to an LED module.

BACKGROUND ART

LED modules including an LED chip are used as a light source of various electronic devices. In particular, LED modules provided with a reflector for reflecting light to provide light collection effect are used as a high brightness type.

FIGS. 29 and 30 show an example of a conventional method for manufacturing an LED module. In this method, a pair of leads 91A and 91B are first prepared, as shown in FIG. 29. Then, by insert molding using a mold, a case 93 made of a resin is provided that partially covers each of the leads 91A and 91B. The case 93 includes a reflector 93a. Then, as shown in FIG. 30, an LED chip 92 is bonded to the lead 91A. Then, two electrodes (not shown) provided on the upper surface of the LED chip 92 are connected to the leads 91A and 91B by using wires 92a. Then, the leads 91A and 91B are cut into an appropriate length, and necessary process steps are performed, such as bending the leads at portions projecting from the case 93. Thus, the LED module is completed.

In the step of mounting the LED chip 92, the capillary for bonding the wire 92a onto the LED chip 92 can interfere with the case 93. To avoid this, the shape and size of the case 93 need to be determined such that a sufficient space is secured between the reflector 93a and the LED chip 92. This hinders size reduction of the LED module. Moreover, in the step of mounting the LED chip 92, the case 93 may be excessively heated, and hence, may be deformed or discolored. Thus, the LED chip 92 has to be mounted by a method which does not easily cause heat generation. This leads to insufficient bonding strength of the LED chip 92 and makes it difficult to increase the life of the LED module.
Patent Document 1: JP-A-2008-10591

SUMMARY OF THE INVENTION

Problems to be Solved by the Invention

The present invention has been conceived under the circumstances described above. It is therefore an object of the present invention to provide a method for manufacturing an LED module that allows making a long-life compact LED module, and an LED module.

Means for Solving the Problems

According to a first aspect of the present invention, there is provided a method for manufacturing an LED module. The method comprises the following steps. An LED chip is mounted on an obverse surface of a lead. After the LED chip is mounted, a case is formed to cover part of the lead and include a reflective surface surrounding the LED chip in an in-plane direction of the lead.

In a preferred embodiment of the present invention, the method further comprises the step of providing a protective resin that directly covers the LED chip, where the providing of the protective resin is performed after the step of mounting the LED chip and before the step of forming the case.

In a preferred embodiment of the present invention, the protective resin contains a fluorescent substance that emits light due to excitation by light from the LED chip, where the emitted light has a wavelength different from the wavelength of the light from the LED chip.

In a preferred embodiment of the present invention, the method further comprises the step of providing an auxiliary resin after the step of mounting the LED chip and before the step of providing the protective resin, where the auxiliary resin covers an end surface of the lead and a part of the LED chip that is not covered by the lead.

In a preferred embodiment of the present invention, in providing the protective resin, the protective resin is arranged to include a reverse surface portion that covers part of the reverse surface of the lead that is opposite from the obverse surface on which the LED chip is mounted. Further, in forming the case, the case is arranged to cover the reverse surface portion of the protective resin.

In a preferred embodiment of the present invention, the method further comprises the step of providing a sealing resin after the case is formed, where the sealing resin fills a space surrounded by the reflective surface.

In a preferred embodiment of the present invention, the sealing resin contains a fluorescent substance that emits light due to excitation by light from the LED chip, where the emitted light has a wavelength different from the wavelength of the light from the LED chip.

In a preferred embodiment of the present invention, the LED chip is of a flip-chip type.

In a preferred embodiment of the present invention, in mounting the LED chip, the LED chip is mounted by eutectic bonding.

According to a second aspect of the present invention, there is provided an LED module comprising a lead, an LED chip mounted on an obverse surface of the lead, a protective resin directly covering the LED chip, and a case covering part of the lead and including a reflective surface surrounding the LED chip in an in-plane direction of the lead. The protective resin includes a reverse surface portion that covers part of the reverse surface of the lead that is opposite from the obverse surface on which the LED chip is mounted. The case covers the reverse surface portion of the protective resin.

In a preferred embodiment of the present invention, the protective resin contains a fluorescent substance that emits light due to excitation by light from the LED chip, where the emitted light has a wavelength different from the wavelength of the light from the LED chip.

In a preferred embodiment of the present invention, the LED module further comprises a sealing resin that fills a space surrounded by the reflective surface and that contains a fluorescent substance that emits light due to excitation by light from the LED chip, where the emitted light has a wavelength different from the wavelength of the light from the LED chip.

Other features and advantages of the present invention will become more apparent from the detailed description given below with reference to the accompanying drawings.

BEST MODE FOR CARRYING OUT THE INVENTION

Preferred embodiments of the present invention are described below with reference to the accompanying drawings.

FIGS. 1-5 show a method for manufacturing an LED module according to a first embodiment of the present invention, and an LED module manufactured by this method.

Figure 1:
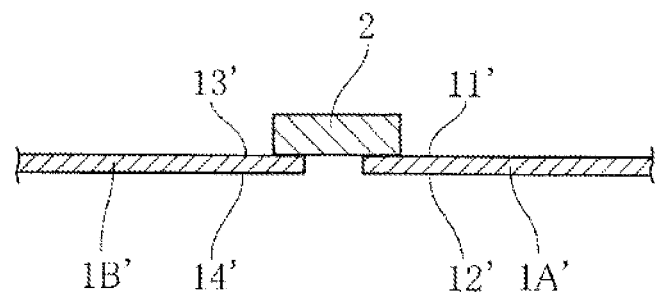
FIG. 1 is a schematic sectional view showing a bonding step in a method for manufacturing an LED module according to a first embodiment of the present invention.

In this embodiment, a pair of leads 1A' and 1B' are first prepared, as shown in FIG. 1. The leads 1A' and 1B' are plate-like parts made of e.g. an alloy of Cu or Ni or these alloys plated with Ag. In this embodiment, the paired leads 1A' and 1B' are connected to a frame, not shown, and prepared as part of a lead frame.

Figure 2:
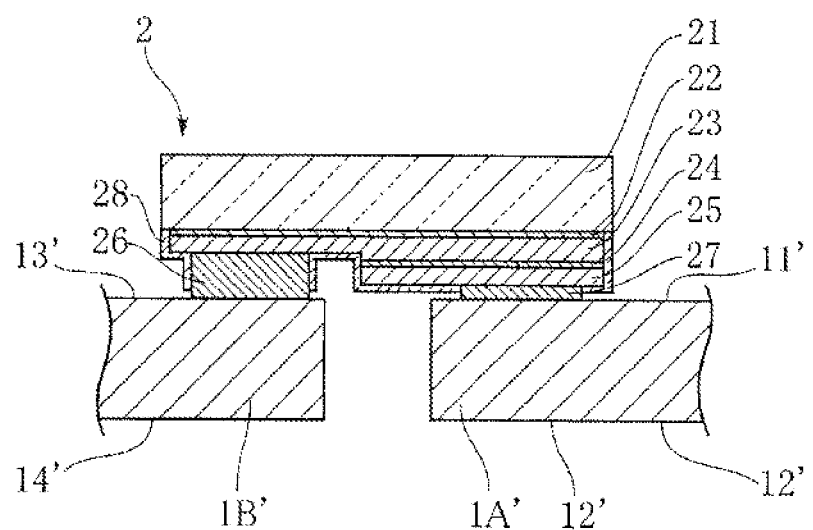
FIG. 2 is an enlarged schematic sectional view of the LED chip shown in FIG. 1.

Then, an LED chip 2 is bonded to the paired leads 1A' and 1B'. As shown in FIG. 2, the LED chip 2 is of a flip-chip type and includes a substrate 21, a buffer layer 22, an n-type semiconductor layer 23, an active layer 24, a p-type semiconductor layer 25, an n-side electrode 26, a p-side electrode 27 and an insulating layer 28. The substrate 21 is made of e.g. sapphire and serves as a base of the LED chip 2. The buffer layer 22 is provided to mitigate lattice distortion between the substrate 21 and the n-type semiconductor layer 23 and made of e.g. a GaN-based semiconductor. The n-type semiconductor layer 23 is bonded to the substrate 21 via the buffer layer 22 and made of e.g. an n-GaN-based semiconductor. The active layer 24 has an MQW (multiple-quantum well) structure and is provided to amplify the light emitted due to recombination of electrons supplied from the n-side electrode 26 and holes supplied from the p-side electrode 27. The active layer 24 comprises e.g. a plurality of InGaN layers and a plurality of GaN layers, that are alternately laminated. The p-type semiconductor layer 25 is on the opposite side of the n-type semiconductor layer 23 across the active layer 24 and made of e.g. p-GaN based semiconductor layer. The n-side electrode 26 is electrically connected to the n-type semiconductor layer 23, whereas the p-side electrode 27 is electrically connected to the p-type semiconductor layer 25. For instance, the n-side electrode 26 and the p-side electrode 27 comprise lamination of Al or Ni or comprise a metal layer containing W, Zr or Pt. The insulating layer 28 is made of e.g. $SiO_2$ and covers the n-type semiconductor layer 23 and the p-type electrode layer 25, with the n-side electrode 26 and the p-side electrode 27 left exposed. The LED chip 2 having this structure emits e.g. blue light from the active layer 24.

Bonding of the LED chip 2 to the paired leads 1A' and 1B' may be performed by eutectic bonding. Specifically, with the p-side electrode 27 pressed against the obverse surface 11' of the lead 1A' and the n-side electrode 26 pressed against the obverse surface 13' of the lead 1B', the paired leads 1A' and 1B' and the LED chip 2 are heated to e.g. about 300° C. This causes eutectic reaction, which bonds the LED chip 2 to the paired leads 1A' and 1B'.

Figure 3:
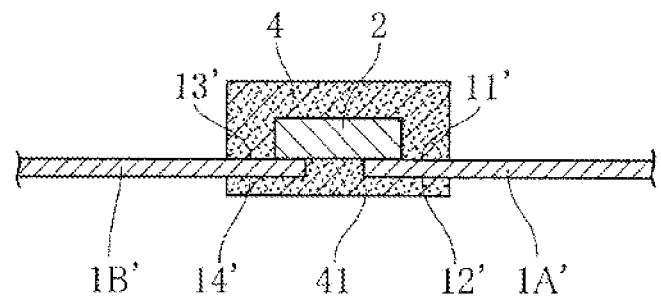
FIG. 3 is a schematic sectional view showing a step of providing a protective resin in the LED module manufacturing method according to the first embodiment of the present invention.

Then, a protective resin 4 is provided, as shown in FIG. 3. The protective resin 4 may be provided by injecting a resin material into the cavity of a mold so as to flatten the top surface of the resin, and then hardening the material, with the LED chip 2 and part of each of the leads 1A' and 1B' enclosed in the mold. For instance, the resin material is a transparent silicone resin that allows light from the LED chip 2 to pass through, mixed with a fluorescent substance that emits light of a different wavelength when excited by the light from the LED chip 2. As such a fluorescent substance, use may be made of one that emits yellow light when excited by blue light or a mixture of a substance that emits red light when excited by blue light and a substance that emits green light when excited by blue light. The protective resin 4 includes a reverse surface portion 41 that covers reverse surfaces 12' and 14' of the leads 1A' and 1B'. The reverse surface portion 41 projects downward from the paired leads 1A' and 1B'.

Figure 4:
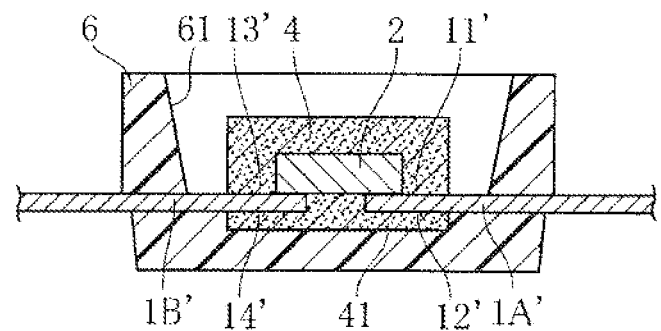
FIG. 4 is a schematic sectional view showing a step of providing a case in the LED module manufacturing method according to the first embodiment of the present invention.

Then, a case 6 is formed, as shown in FIG. 4. The forming of the case 6 is performed by insert molding. In the insert molding, a mold is set to sandwich the leads 1A' and 1B' at positions avoiding the protective resin 4, and then a resin material is injected into the cavity and hardened. As the resin material, use may be made of a white epoxy resin, a rigid silicone resin or the like. The case 6 covers part of each lead 1A', 1B' and includes a reflective surface 61. The reflective surface 61 surrounds the LED chip 2 and the protective resin 4 on four sides while being spaced apart from these parts, and reflects the light from the LED chip 2 upward.

Figure 5:
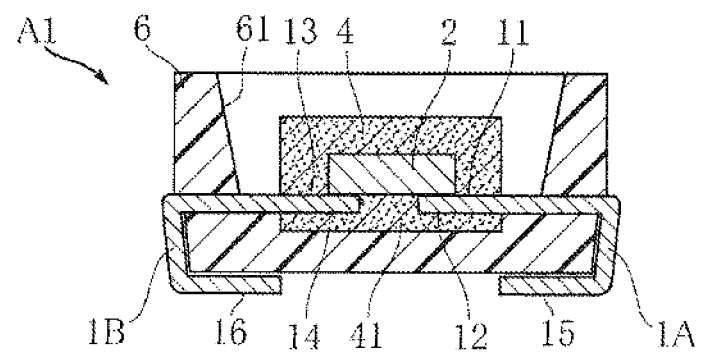
FIG. 5 is a sectional view showing an example of LED module according to the present invention.

Then, the paired leads 1A' and 1B' are cut and bent at appropriate positions. Thus, a pair of leads 1A and 1B bent along the case 6 are obtained. By the above process, the LED module A1 shown in FIG. 5 is obtained. On the obverse surfaces 11 and 13 of the leads 1A and 1B are bonded the LED chip 2. The reverse surfaces 12 and 14 of the leads 1A and 1B are covered with the protective resin 4 and the case 6. The portions of the leads 1A and 1B that are exposed on the lower side of the case 6 are used as mount terminals 15 and 16 for surface-mounting the LED module A1.

The advantages of the method for manufacturing an LED module according to this embodiment and the LED module A1 are described below.

According to this embodiment, the LED chip 2 is bonded before the case 6 is formed. Thus, there is no risk that the arm for handling the LED chip 2 interferes with the case 6. This allows the distance between the reflective surface 61 and the LED chip 2 to be reduced, and hence allows making the LED module A1 more compact.

Even when the LED chip 2 is bonded by eutectic bonding, the case 6 is not heated by the bonding. Thus, the case 6 is not unfavorably deformed or discolored, which is favorable for making the LED module A1 having a desired shape. Since the case 6 is not discolored, deterioration of the brightness of the LED module A1 is avoided.

The arrangement of this embodiment allows selecting a technique for bonding the LED chip 2 without taking into consideration the influence of the heat generated by bonding on the case 6. Thus, as the bonding method, it is possible to select e.g. eutectic bonding which achieves proper and reliable bonding of the LED chip 2 onto the leads 1A' and 1B'. This is favorable for preventing insufficient bonding of the LED chip 2 and for increasing the life of the LED module A1.

The reverse surface portion 41 of the protective resin 4 is embedded in the case 6. This arrangement ensures enhanced bonding strength between the protective resin 4 and the case 6. In particular, when the protective resin 4 is mainly composed of a silicone resin while the case 6 is mainly composed of a rigid silicone resin, the mutually contacting portion of these parts have a good affinity, which is favorable for enhancing the bonding strength.

FIGS. 6-28 show other embodiments of the present invention. In these figures, the elements that are identical or similar to those of the foregoing embodiment are designated by the same reference signs as those used for the foregoing embodiment.

Figure 6:
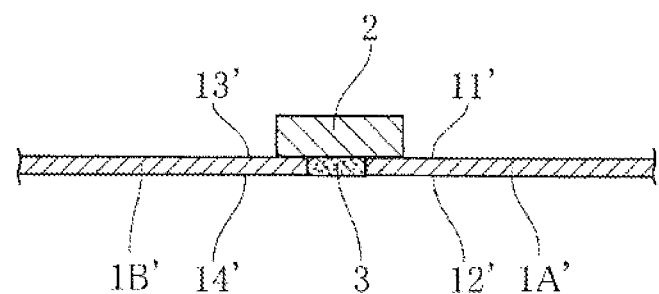
FIG. 6 is a schematic sectional view showing a step of providing an auxiliary resin in a method for manufacturing an LED module according to a second embodiment of the present invention.
Figure 7:
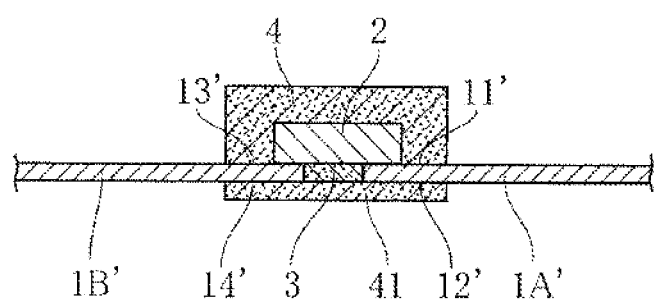
FIG. 7 is a schematic sectional view showing a step of providing a protective resin in the LED module manufacturing method according to the second embodiment of the present invention.

FIGS. 6 and 7 show a method for manufacturing an LED module according to a second embodiment of the present invention. In this embodiment, as shown in FIG. 6, after an LED chip 2 is bonded to a pair of leads 1A' and 1B', an auxiliary resin 3 is provided. The auxiliary resin 3 covers a portion of the lower surface of the LED chip 2 that is positioned between the leads 1A' and 1B', and end surfaces of the leads 1A' and 1B'. For instance, the material for the auxiliary resin 3 may be a transparent silicone resin, mixed with a fluorescent substance that emits light of a different wavelength when excited by the light from the LED chip 2. This material may be the same as the material for the protective resin 4 of the foregoing embodiment, but not limited to this.

Then, a protective resin 4 is provided, as shown in FIG. 7. The provision of the protective resin 4 is performed in a similar way to that described with reference to FIG. 3. In this embodiment, however, molding is performed, with the auxiliary resin 3 housed in a cavity of a mold, not shown, in addition to the LED chip 2 and part of each lead 1A', 1B'. The protective resin 4 provided in this way covers the LED chip 2, part of each lead 1A', 1B', and the auxiliary resin 3. Thereafter, the process step for forming the case 6 and the process step for obtaining the paired leads 1A, 1B are performed in a similar way to the above-described manufacturing method, whereby an LED module is obtained.

According to this embodiment, the auxiliary resin 3 reinforces the bonding between the LED chip 2 and the leads 1A', 1B'. Thus, problems such as separation of the LED chip 2 from the leads 1A, 1B are suppressed.

Figure 8:
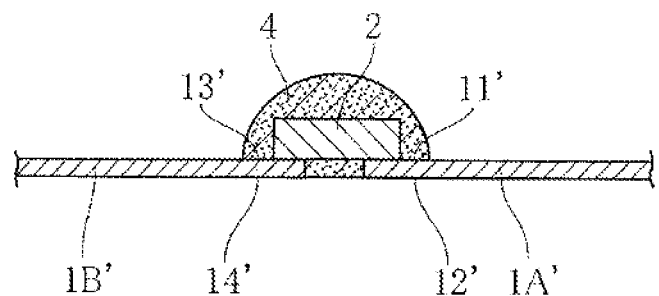
FIG. 8 is a schematic sectional view showing a step of providing a protective resin in a method for manufacturing an LED module according to a third embodiment of the present invention.
Figure 9:
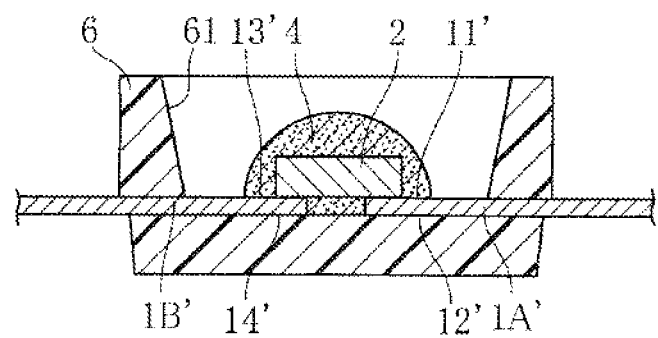
FIG. 9 is a schematic sectional view showing a step of providing a case in the LED module manufacturing method according to the third embodiment of the present invention.

FIGS. 8 and 9 show a method for manufacturing an LED module according to a third embodiment of the present invention. The method for manufacturing an LED module according to this embodiment is different from the foregoing methods in technique for providing the protective resin 4. In this embodiment, the protective resin 4 is provided by potting, as shown in FIG. 8. Specifically, a resin material in a liquid state is dropped from above to cover the LED chip 2 bonded to the paired leads 1A' and 1B'. The resin material dropped in this way covers the LED module 2 while forming a dome shape due to surface tension. By hardening the resin material in this state, the protective resin 4 is obtained. Then, a case 6 is formed by insert molding, as shown in FIG. 9.

In this embodiment again, the case 6 is not exposed to the heat generated in bonding the LED chip 2. Thus, this embodiment also ensures that the LED module has a high brightness and a long life.

Figure 10:
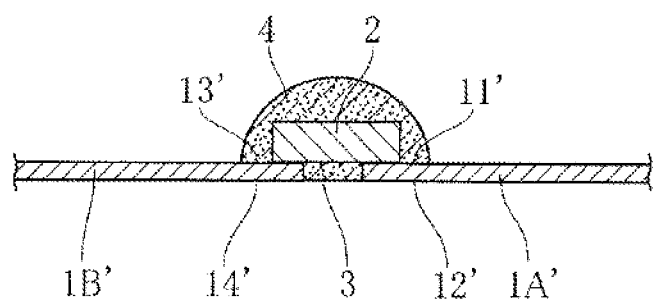
FIG. 10 is a schematic sectional view showing a step of providing a protective resin in the LED module manufacturing method according to the fourth embodiment of the present invention.
Figure 11:
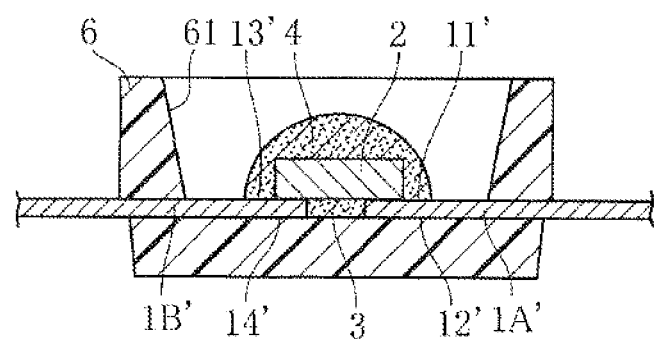
FIG. 11 is a schematic sectional view showing a step of providing a case in the LED module manufacturing method according to the fourth embodiment of the present invention.

FIGS. 10 and 11 show a method for manufacturing an LED module according to a fourth embodiment of the present invention. In the LED module manufacturing method of this embodiment, the protective resin 4 is provided by potting as shown in FIG. 10 after the auxiliary resin 3 is provided as shown in FIG. 6. Then, the case 6 is formed by insert molding, as shown in FIG. 11.

Figure 12:
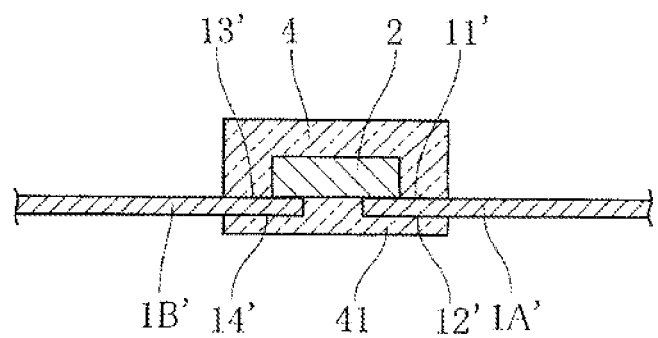
FIG. 12 is a schematic sectional view showing a step of providing a protective resin in a method for manufacturing an LED module according to a fifth embodiment of the present invention.
Figure 13:
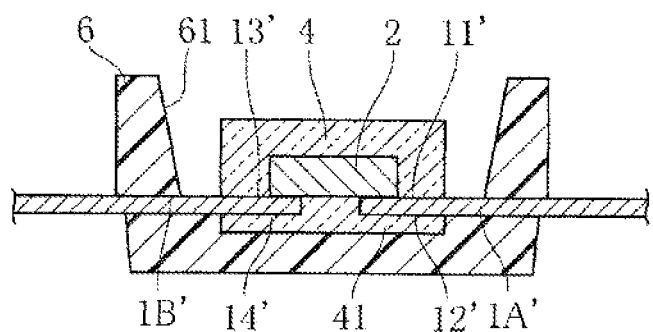
FIG. 13 is a schematic sectional view showing a step of providing a case in the LED module manufacturing method according to the fifth embodiment of the present invention.
Figure 14:
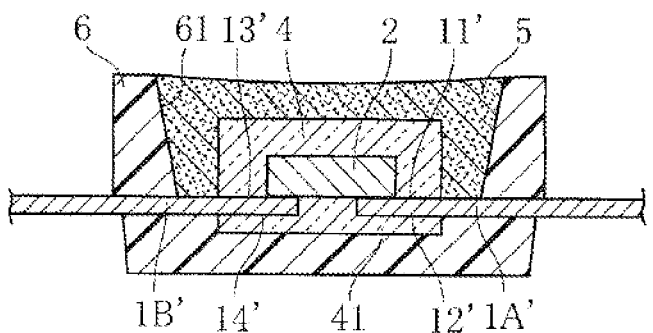
FIG. 14 is a schematic sectional view showing a step of providing a sealing resin in the LED module manufacturing method according to the fifth embodiment of the present invention.

FIGS. 12-14 show a method for manufacturing an LED module according to a fifth embodiment of the present invention. In this embodiment, a transparent protective resin 4 is first provided, as shown in FIG. 12. Unlike the foregoing embodiments, a transparent resin such as a silicone resin which is not mixed with a fluorescent substance is used as the material for the protective resin 4. Then, as shown in FIG. 13, a case 6 is formed by insert molding. Then, as shown in FIG. 14, a sealing resin 5 is provided by injecting a resin material in a liquid state into a space surrounded by the reflective surface 61 and then hardening the resin material. As the resin material for the sealing resin 5, use may be made of a transparent silicone resin mixed with a fluorescent substance. According to this embodiment, the LED chip 2 is protected by both of the protective resin 4 and the sealing resin 5, which is favorable for increasing the life of the LED module.

Figure 15:
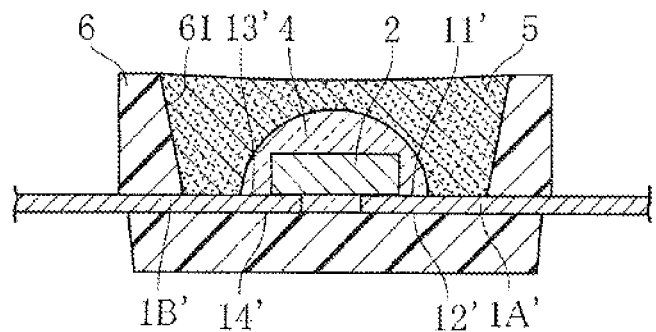
FIG. 15 is a schematic sectional view showing a step of providing a sealing resin in a method for manufacturing an LED module according to a sixth embodiment of the present invention.

FIG. 15 shows a method for manufacturing an LED module according to a sixth embodiment of the present invention. This embodiment is different from the above-described fifth embodiment in technique for providing the protective resin 4. In this embodiment, the protective resin 4 is provided by potting. This embodiment also ensures that the life of the LED module is increased.

Figure 16:
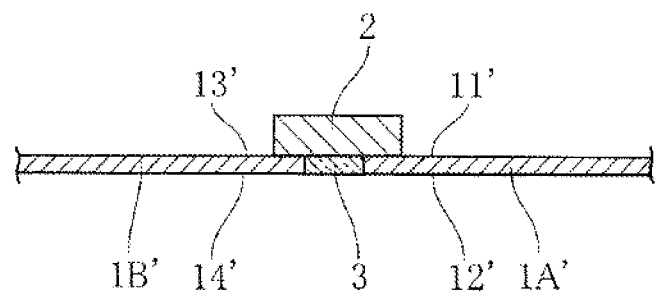
FIG. 16 is a schematic sectional view showing a step of providing an auxiliary resin in a method for manufacturing an LED module according to a seventh embodiment of the present invention.
Figure 17:
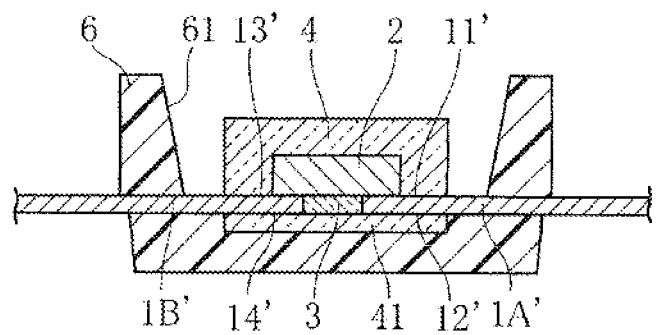
FIG. 17 is a schematic sectional view showing a step of providing a protective resin and a case in the LED module manufacturing method according to the seventh embodiment of the present invention.
Figure 18:
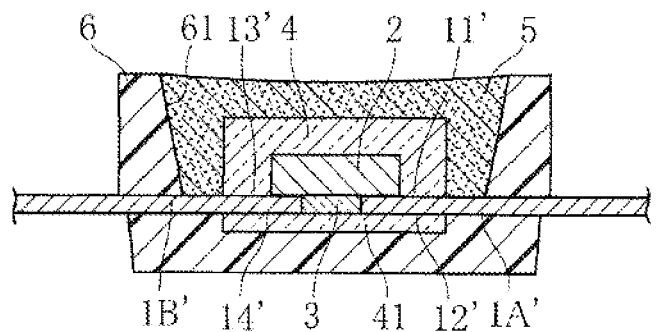
FIG. 18 is a schematic sectional view showing a step of providing a sealing resin in the LED module manufacturing method according to the seventh embodiment of the present invention.

FIGS. 16-18 show a method for manufacturing an LED module according to a seventh embodiment of the present invention. In this embodiment, as shown in FIG. 16, after the LED chip 2 is bonded to a pair of leads 1A' and 1B', an auxiliary resin 3 is provided by using e.g. a transparent silicone resin. Then, as shown in FIG. 17, a protective resin 4 is provided by molding using e.g. a transparent silicone resin, and then a case 6 is formed by insert molding. Then, as shown in FIG. 18, a sealing resin 5 is provided by using a resin material which may be a transparent silicone resin mixed with a fluorescent substance.

Figure 19:
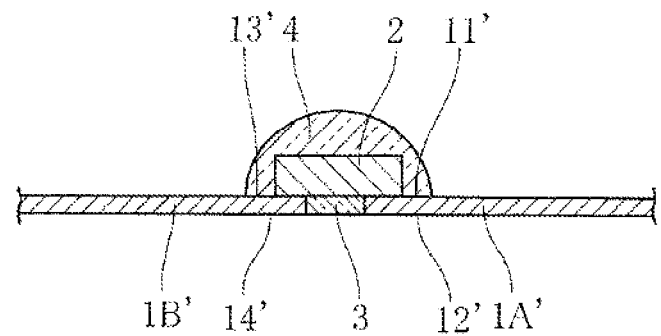
FIG. 19 is a schematic sectional view showing a step of providing a protective resin in a method for manufacturing an LED module according to an eighth embodiment of the present invention.
Figure 20:
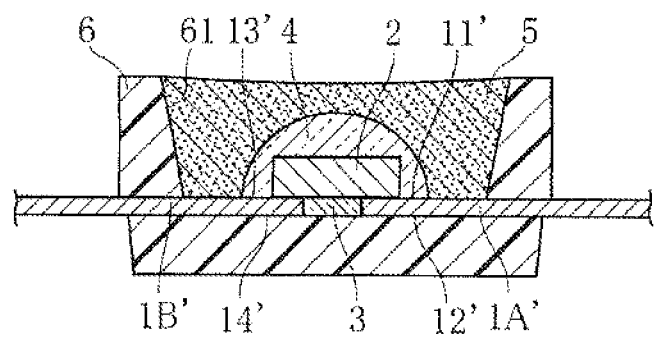
FIG. 20 is a schematic sectional view showing a step of providing a case and a sealing resin in the LED module manufacturing method according to the eighth embodiment of the present invention.

FIGS. 19 and 20 show a method for manufacturing an LED module according to an eighth embodiment of the present invention. In this embodiment, after the auxiliary resin 3 is provided as shown in FIG. 16, a protective resin 4 is provided by potting as shown in FIG. 19. Both of the auxiliary resin 3 and the protective resin 4 are made of e.g. a transparent silicone resin. Then, as shown in FIG. 20, a sealing resin 5 is provided by using a resin material which may be a transparent silicone resin mixed with a fluorescent substance.

Figure 21:
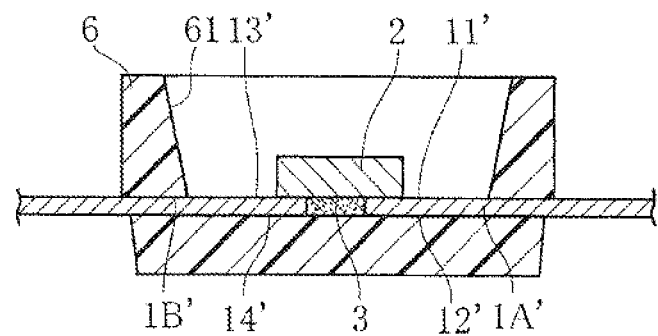
FIG. 21 is a schematic sectional view showing a step of providing a case in a method for manufacturing an LED module according to a ninth embodiment of the present invention.
Figure 22:
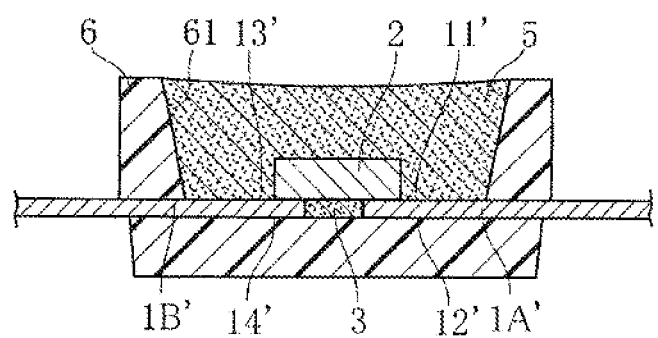
FIG. 22 is a schematic sectional view showing a step of providing a sealing resin in the LED module manufacturing method according to the ninth embodiment of the present invention.

FIGS. 21 and 22 show a method for manufacturing an LED module according to a ninth embodiment of the present invention. In this embodiment, after the auxiliary resin 3 is provided as shown in FIG. 6 of the manufacturing method according to the second embodiment, a case 6 is formed as shown in FIG. 21. Thereafter, a sealing resin 5 is provided as shown in FIG. 22.

Figure 23:
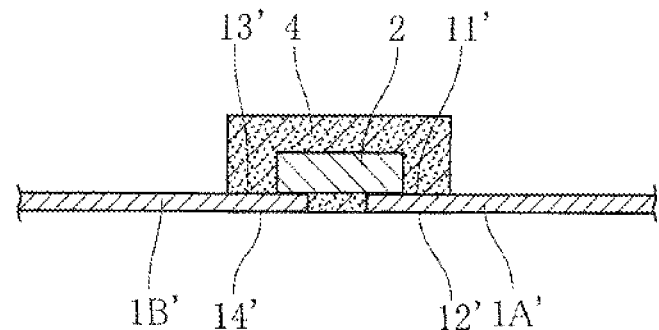
FIG. 23 is a schematic sectional view showing a step of providing a protective resin in a method for manufacturing an LED module according to a tenth embodiment of the present invention.
Figure 24:
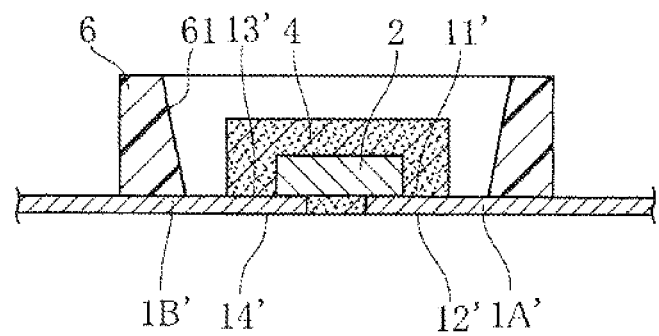
FIG. 24 is a schematic sectional view showing a step of providing a case in the LED module manufacturing method according to the tenth embodiment of the present invention.

FIGS. 23 and 24 show a method for manufacturing an LED module according to a tenth embodiment of the present invention. In this embodiment, a protective resin 4 is provided by molding, as shown in FIG. 23. In this process, the reverse surface portion 41, which is provided in the manufacturing method described with reference to FIG. 3, is not provided. Thus, the reverse surfaces 12' and 14' of the leads 1A' and 1B' is not covered with the protective resin 4. Then, as shown in FIG. 24, a case 6 is formed by insert molding. The case 6 also has a shape that does not cover the reverse surfaces 12' and 14' of the leads 1A' and 1B'.

Figure 25:
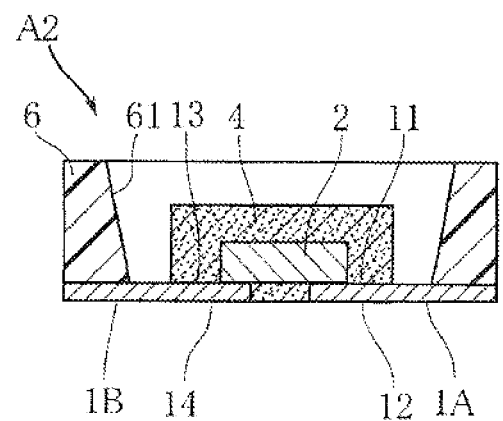
FIG. 25 is a sectional view showing another example of LED module according to the present invention.

Then, the paired leads 1A' and 1B' are cut so that the portions of the leads 1A' and 1B' that project from the case 6 are removed, whereby the LED module A2 shown in FIG. 25 is obtained. The reverse surfaces 12 and 14 of the leads 1A and 1B, which are not covered with the case 6, are used as mount terminals for mounting the LED module A2.

In this embodiment again, a high brightness and a long life of the LED module A2 are ensured. Further, the thickness of the LED module A2 is reduced.

Figure 26:
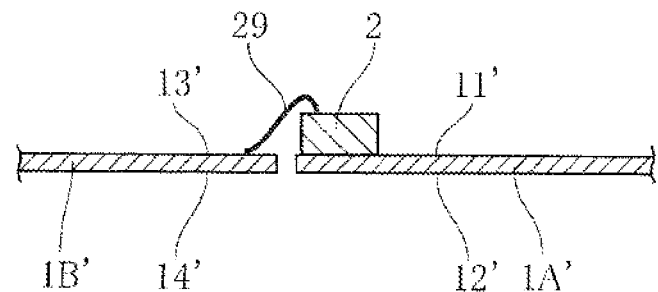
FIG. 26 is a schematic sectional view showing a bonding step in a method for manufacturing an LED module according to an eleventh embodiment of the present invention.
Figure 27:
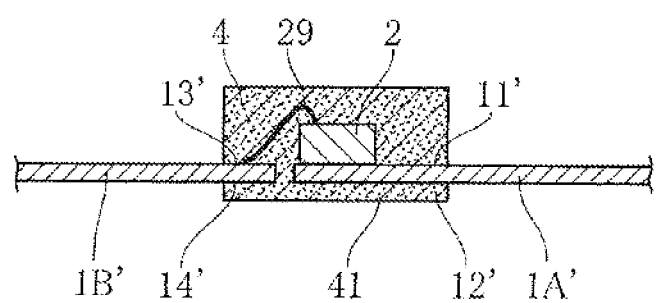
FIG. 27 is a schematic sectional view showing a step of providing a protective resin in the LED module manufacturing method according to the eleventh embodiment of the present invention.
Figure 28:
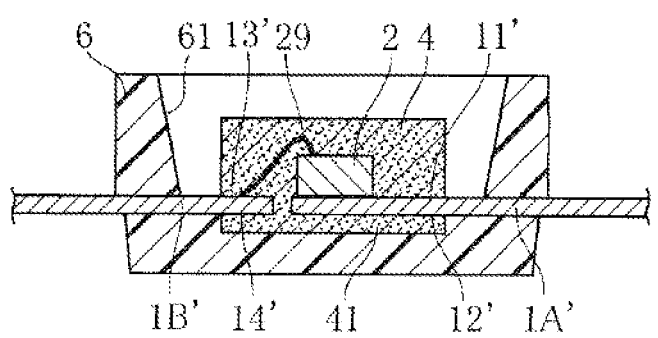
FIG. 28 is a schematic sectional view showing a step of providing a case in the LED module manufacturing method according to the eleventh embodiment of the present invention.
Figure 29:
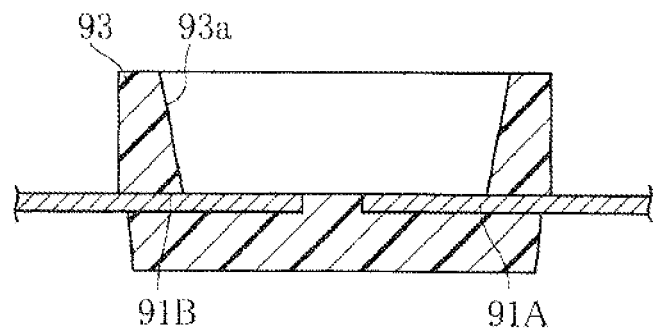
FIG. 29 is a schematic sectional view showing a step of providing a case in a conventional method for manufacturing an LED module.
Figure 30:
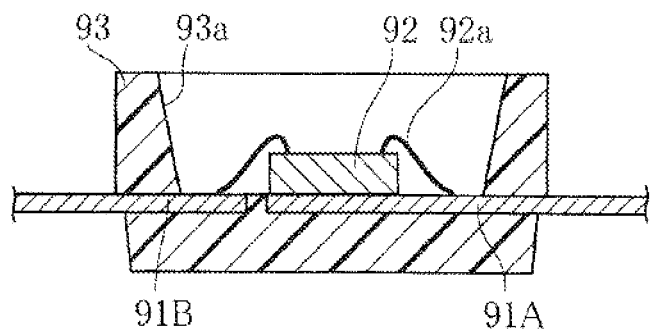
FIG. 30 is a schematic sectional view showing a bonding step in the conventional method for manufacturing an LED module.

FIGS. 26-28 show a method for manufacturing an LED module according to an eleventh embodiment of the present invention. In this embodiment, the LED chip 2 is bonded to the lead 1B' by using a wire 29, as shown in FIG. 26. Specifically, the LED chip 2 is of the type which has one electrode on each of the upper surface and the lower surface. The LED chip 2 is bonded to the obverse surface 11' of the lead 1A' by using a conductive paste or by eutectic bonding, for example. The electrode on the upper surface of the LED chip 2 and the obverse surface 13' of the lead 1B' are bonded by wire bonding.

Thereafter, as shown in FIG. 27, a protective resin 4 is provided to cover the LED chip 2 and the wire 29. Then, a case 6 is formed, as shown in FIG. 28. As will be understood from this embodiment, the LED chip 2 is not limited to a flip-chip type, and various types of LED chips can be employed, including one that is to be bonded by using a single wire 29 and one that has two electrodes on the upper surface and is to be bonded by using two wires 29.

The LED module manufacturing method and the LED module according to the present invention are not limited to the foregoing embodiments. The specific structure of the LED module manufacturing method and the LED module may be varied in design in many ways.

The invention claimed is:
1. A method for manufacturing an LED module, the method comprising:
preparing a first lead, a second lead, and an LED chip provided with a first electrode and a second electrode, the first lead having an end surface that faces in the direction of the second lead and the second lead having an end surface that faces in the direction of the first lead;
mounting the LED chip on obverse surfaces of the first lead and the second lead in a manner such that the first electrode is held in contact with the first lead and the second electrode is held in contact with the second lead;
providing an auxiliary resin after the mounting of the LED chip, the auxiliary resin being in contact with the respective facing end surfaces of each of the first lead and the second lead and a part of a lower surface of the LED chip that is not covered by the first lead and the second lead so as to mechanically connect the LED chip to the first and the second leads;
providing a protective resin directly covering the LED chip after the providing of the auxiliary resin;
forming a case with a resin after the providing of the protective resin, the case covering part of each of the first lead and the second lead and defining a reflective surface surrounding the LED chip; and
filling a space surrounded by the reflective surface with a sealing resin containing a fluorescent substance so as to cover the protective resin.

2. The method for manufacturing an LED module according to claim 1, wherein:

in providing the protective resin, the protective resin is arranged to include a reverse surface portion that covers part of a reverse surface of each of the first and second leads that is opposite from the obverse surface on which the LED chip is mounted; and in forming the case, the case is arranged to cover the reverse surface portion of the protective resin.

3. The method for manufacturing an LED module according to claim 1, wherein the fluorescent substance contained in the sealing resin emits light due to excitation by light from the LED chip, the emitted light having a wavelength different from a wavelength of the light from the LED chip.

4. The method for manufacturing an LED module according to claim 1, wherein the LED chip is of a flip-chip type.

5. The method for manufacturing an LED module according to claim 4, wherein in mounting the LED chip, the LED chip is mounted by eutectic bonding.

6. The method for manufacturing an LED module according to claim 1, wherein the protective resin covers, at least, part of a reverse surface of the first lead and part of a reverse surface of the second lead.

7. The method for manufacturing an LED module according to claim 1, wherein the case includes a bottom portion covering the reverse surface portion of the protective resin, and the bottom portion and the reflective surface of the case are disposed on mutually opposed sides with respect to the obverse surfaces of the first and the second leads.

8. The method for manufacturing an LED module according to claim 1, wherein the protective resin as a whole is spaced apart from a reverse surface of the first lead and a reverse surface of the second lead.

9. The method for manufacturing an LED module according to claim 1, wherein the protective resin has a flat top surface or a dome shape.

10. The method for manufacturing an LED module according to claim 1, wherein the providing of the auxiliary resin is performed with the LED chip disposed vertically upward of the first and the second leads.

* * * * *